United States Patent [19]

Steiner

[11] 4,291,404

[45] Sep. 22, 1981

[54] AUTOMATIC CIRCUIT TESTER WITH IMPROVED VOLTAGE REGULATOR

[75] Inventor: William G. Steiner, Marietta, Ga.

[73] Assignee: Lockheed Corporation, Burbank, Calif.

[21] Appl. No.: 96,030

[22] Filed: Nov. 20, 1979

[51] Int. Cl.³ .............................................. G06F 11/22
[52] U.S. Cl. .................................. 371/20; 324/73 AT
[58] Field of Search ...................... 371/20; 324/73 AT; 364/200

[56] References Cited

U.S. PATENT DOCUMENTS

| | | | |
|---|---|---|---|
| 3,691,531 | 9/1972 | Saltini et al. | 364/200 |
| 4,108,358 | 8/1978 | Niemascyk et al. | 371/20 |
| 4,168,527 | 9/1979 | Winkler | 371/20 X |
| 4,174,805 | 11/1979 | Fulks et al. | 371/20 X |
| 4,180,203 | 12/1979 | Masters | 371/20 |

OTHER PUBLICATIONS

Schwab, "IC Testing: A Complete System", *Kilobaud the Small Computer Magazine*, Nov. 1978, pp. 70–80.
Ruckdeschel, "IC Logic Tester and Parallel I/O Expander *Kilobaud Microcomputing*, Jul. 1979, pp. 26–39.
Tang, "Discrete Regulator Design Regulates Close to Supply Bus", *Electronic Design*, Aug. 2, 1980, p. 102.

*Primary Examiner*—David H. Malzahn
*Attorney, Agent, or Firm*—John J. Sullivan

[57] ABSTRACT

A battery operated microcomputer controlled programmable circuit testing device. Standard I/O/memory devices (25a, 25b) are connected to a microcomputer (20) in such a manner as to treat the I/O ports (46, 47) of the I/O memory devices as programmable interfaces and to allow pin receptors in a socket (10) to be individually programmed as inputs or outputs. Double detent switches (12, 13) connected to testable inputs T0, T1, 45) the microcomputer are used to scroll a roll table containing names of devices which may be tested in either a forward or a reverse direction at two different speeds. Compression of the roll table storage is provided by storing only data which differs from the previous element. A power supply (17) having a regulator featuring a series pass transistor (150) connected as a common collector amplifier is shown. The power supply is turned on and off by switching devices (11, 151, 160, 159) which control base current only to a transistor switch (155, 170) operating analog circuitry (157) which controls the pass transistor. Microcomputer control (181) of the power supply and self latching embodiments are also shown. The power supply shown herein can successfully regulate output voltages which differ from the raw DC input by no more than the saturation voltages of series pass transistor.

3 Claims, 10 Drawing Figures

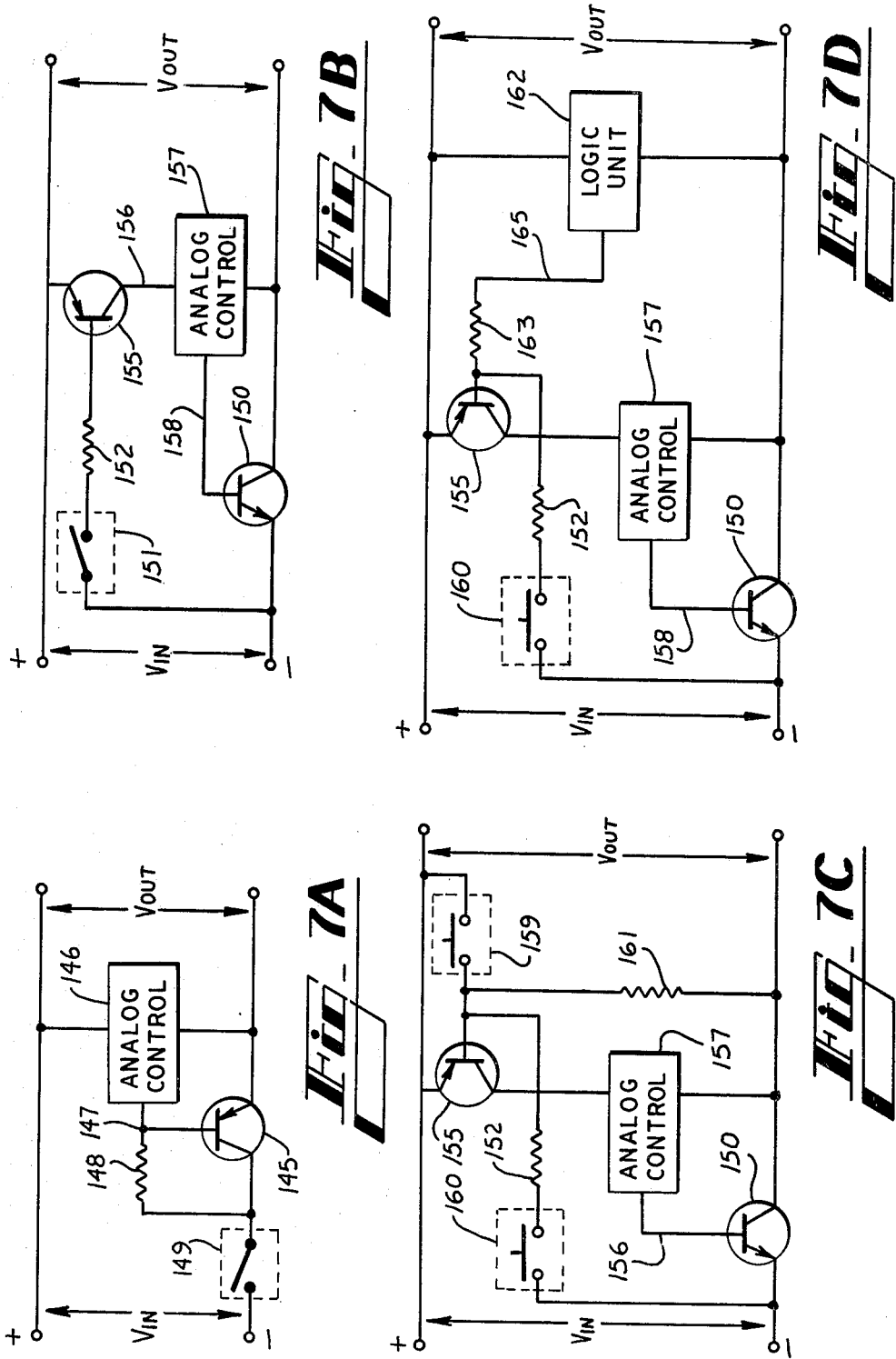

AUTOMATIC CIRCUIT TESTER WITH IMPROVED VOLTAGE REGULATOR

TECHNICAL FIELD

The present invention relates to circuit testing devices and more particularly to portable digital logic testing apparatus with a programmable interface between unit under test and testing apparatus so that a plurality of different circuits may be tested.

BACKGROUND OF THE INVENTION

The present invention relates to a portable circuit tester. In recent years there has been a virtual explosion in the market for integrated circuit electronics, both analog and digital. In many applications where high precision and a tolerance of extreme environmental conditions are required, hybrid integrated circuits are also popular.

Today there are hundreds of standard integrated circuits available all of which fit in one of several standard socket configurations. The most widely known configuration being a standard dual-in-line (DIP) socket for circuits having between four and sixteen pins. More recently twenty-four pin and forty pin dual-in-line configurations having wider spacing between the rows of sockets have become popular in the field of large scale integrated circuits (LSI).

It is been desirable to have an automatic testing apparatus for circuitry provided by a manufacturer as a quality control tool.

As greater and greater circuit density has been obtained in the field of integrated circuits, together with the ability to fabricate circuits on relatively large chips, the field of large scale integrated circuits has provided extremely complex functions available in standard integrated circuit (IC) packages. Many modern integrated circuits contain such complex functions that it is impractical to manually manipulate equipment to sequentially test various inputs and outputs in order to ascertain whether the circuit is operating properly. This increases the need for automated equipment which can take advantage of the inherent speed associated with the integrated circuit and perform a test of all possible inputs in a short period of time.

The proliferation of the use of integrated circuits in consumer products has created a need for a portable testing device for complex integrated circuits. It is becoming more and more difficult for maintenance personnel to ascertain when a particular integrated circuit in a device has failed. This is particularly true in apparatus where an integrated circuit may fail during a particular step of a sequential set of functions but the failure will not be apparent during steady state conditions under which the maintenance personnel may be performing tests.

Examples of previous automatic test equipment which includes programmable test routines are shown in U.S. Pat. No. 3,764,995 to Helf et al.; U.S. Pat. No. 3,622,876 to Ure et al.; and U.S. Pat. No. 4,053,844 to Hamaoui.

A portable programmed circuit tester is shown in U.S. Pat. No. 4,108,358 to Niemaszyk et al. This device includes a central processing unit and a program for executing a plurality of tests for different circuits.

A disadvantage of devices such as those shown in the Niemaszyk et al. patent is that such a device is large and impractical for use in field maintenance work.

Heretofore it has not been known in the art how to miniaturize a device such as that shown in the Niemaszyk et al. patent and to make same operate from a storage battery in a practical manner which allows use of the device in the field.

SUMMARY OF THE INVENTION

The present invention provides a miniaturized hand-held battery operated logic circuit testing apparatus using a minimal number of components.

The present invention also provides a portable logic circuit tester in which all machine functions can be controlled with a minimum number of external inputs by the user.

It is an object of the present invention to provide a portable battery operated logic tester wherein each pin of a socket of standard configuration may be individually defined as an input, output or unused under program control.

It is a further object of the present invention to provide a portable battery operated logic circuit testing apparatus which may be constructed from a one chip microcomputer and a plurality of standard input/output (IO) multiport devices.

It is also an object of the present invention to minimize the memory space required to store user readable information identifying a particular device to be tested.

It is a further object of the present invention to provide a unique power supply whereby standard nickel-cadmium batteries may be used to power circuits under test.

It is a further object of the present invention to provide a portable hand-held battery operated logic circuit tester having a power supply that is controlled by a central processing unit.

It is still a further object of the present invention to provide a battery operated portable logic circuit tester controlled by an integrated circuit microcomputer or microprocessor wherein power to the unit under test and memory devices external to the processor containing instructions for test procedures is not supplied until the beginning of the test cycle, thereby prolonging battery life and eliminating damage to the UUT during insertion, removable and during test procedure selection.

It is a further object of the present invention to provide an improved power supply for battery operated devices which includes a series pass transistor controlled by a shunt derived bias current wherein proper regulation may be maintained down to the saturation point of the pass transistor.

These and other objects of the present invention will become apparent from the detailed description below.

BRIEF DESCRIPTION OF THE DRAWINGS

FIGS. 7A-7D show a conventional power supply regulator and three embodiments of the novel regulator of the present invention.

DETAILED DESCRIPTION

Figure 1:
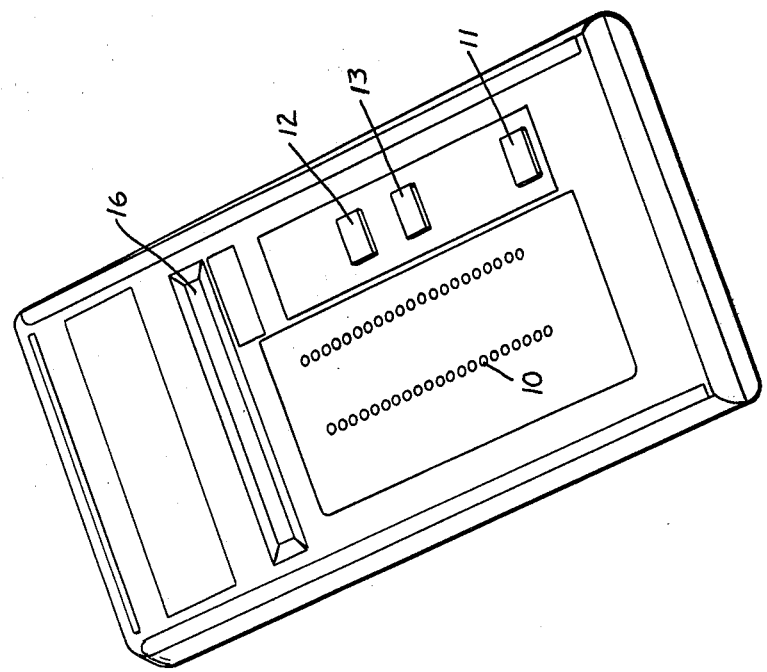
FIG. 1 is a pictorial view of a preferred embodiment of the present invention.

Turning to FIG. 1, the pictorial view of the preferred embodiment of the present invention is shown. The simplicity of operating an embodiment of the present invention may be appreciated from the simplicity of the preferred embodiment as shown in FIG. 1. Socket 10 provides a means for making an electrical connection to a unit under test (UUT). As shown in FIG. 1, socket 10 is embodied by a standard forty pin dual in line socket. It will be appreciated by those skilled in the art that other socket configurations such as those for the Standard Electronic Module (SEM) or the Support Equipment Electronic module (SEEM) are available or that simple adapters from socket 10 to other socket configurations may be used with the present invention.

The preferred embodiment of the present invention is controlled by the operator through the use of three external switches. On/test switch 11 and two double detent switches 12 and 13 which are, respectively, forward (FWD) and reverse (REV).

An alpha numeric display 16 is also provided on the preferred embodiment. In the preferred embodiment a four character display is used and this has been found to be sufficient for indentification of one hundred or more standard circuit modules. It is of course possible to use a greater or lesser number of characters in display 16.

Since use of the preferred embodiment of the present invention is so simple, it will be described in conjunction with FIG. 1. The described operations will be related to the internal machine functions in the description below.

As will be described in further detail hereinbelow, the preferred embodiment of the present invention includes memory which contains instructions for testing approximately one hundred standard devices which may be accepted by socket 10. Internal to the preferred embodiment is a table (or more precisely a means for generating a table) which is arranged in alpha numeric order. This table is referred to as the "roll table" throughout the specification.

In order to activate the preferred embodiment, the user first depresses on-test button 11 which will turn the machine on. Switches 12 and 13 are double detent switches. Therefore the depression of one of these switches a first distance into the device closes a first set of contacts and further depression of the switch closes a second set of contacts. Operation of switches 12 and 13 cause the preferred embodiment to scan through the roll table and display the alpha numeric characters identifying the device to be tested. Depression of switch 12 to its first level causes the table to be scanned in a forward direction (in the alpha numeric sense). Identification characters for alpha numerically sequential devices appear in display 16. Depression of switch 12 to its second level causes the scanning of the roll table to proceed in a forward direction at a much faster rate. Switch 13 causes reverse scanning of the roll table.

When the user has operated switches 12 and 13 so that the alpha numeric word appearing in display 16 corresponds to the device plugged into socket 10, the on/test button 11 is again depressed. The preferred embodiment then performs a series of tests which will test all the relevant combinations of inputs for the unit under test and tests for the proper outputs therefrom. If the unit under test is operating properly an appropriate message is displayed in display 16. If the unit under test fails, an indication that the UUT failed the test as well as an identification of the step in the test procedure which the unit failed will be shown in display 16. This step is of course related to the software controlling the test procedures. External documentation of the testing procedures can identify the particular input/output combination for which the unit under test failed to respond properly if this is considered important to the user.

Under software control, the present invention tests for abnormal loading and short circuits between power supply pins and ground pins for the UUT and will also display an appropriate message indicating the existence of such abnormal conditions.

As will be described hereinbelow, the preferred embodiment also monitors the output voltage of its battery and will display an appropriate message indicating that battery voltage is too low and the battery should be replaced or recharged.

The unit may be turned off by either holding on test button 11 in a depressed state for a predetermined period of time (approximately two seconds in the preferred embodiment) or by failing to provide any input to the device for a second predetermined period of time, approximately thirty seconds in the preferred embodiment.

It will therefore be appreciated that any stored test routine for a particular circuit plugged into socket 10 may be executed quickly and simply to the use of only three external inputs (switches 11, 12 and 13).

Figure 2:
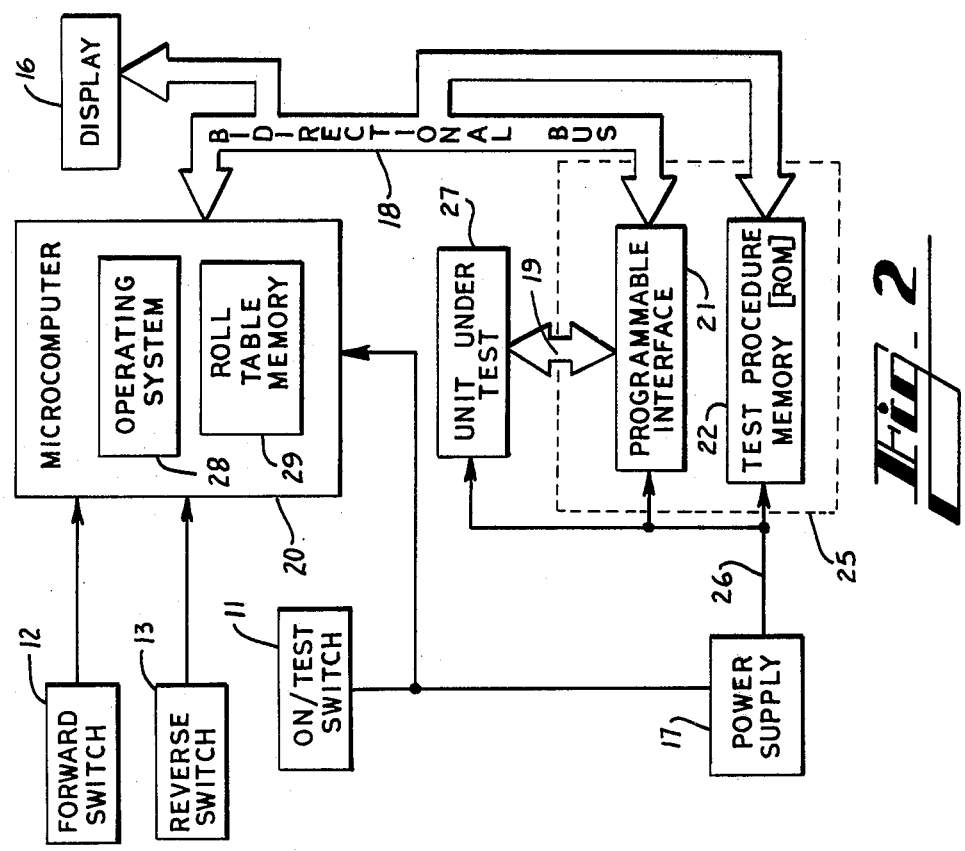
FIG. 2 is a block diagram of the preferred embodiment of the present invention.

Turning to FIG. 2, a block diagram of the preferred embodiment may be seen. As may be seen in FIG. 2, switches 11, 12 and 13 are the only three external inputs which must be user operated to control the present invention. Display 16 is shown as a block in FIG. 2. As may be seen from FIG. 2, switches 12 and 13 are directly connected to an input of a microcomputer 20. On/test switch 11 is connected to both microcomputer 20 and power supply 17.

Microcomputer 20 is connected with the remainder of the preferred embodiment via a bidirectional bus 18 which in FIG. 2 will be understood to include a bidirectional data bus, an address bus, and appropriate control lines.

Bus 18 is connected to I/O/memory block 25 which includes subcomponents of a programmable interface 21 and read only memory 22 which contains instructions for the testing procedure for various units under test. A generalized connection 19 to unit under test 27 is shown in FIG. 2. It will be understood that in the preferred embodiment this connection will manifest itself as socket 10 shown in FIG. 1. Line 26 in FIG. 2 shows that power supply 17 supplies power to I/O/memory block 20 and unit under test 27. As will be described in greater detail hereinbelow, power is supplied only under certain specified conditions under the control of microcomputer 20 thus minimizing the drain on the battery of power supply 17.

Figure 3:
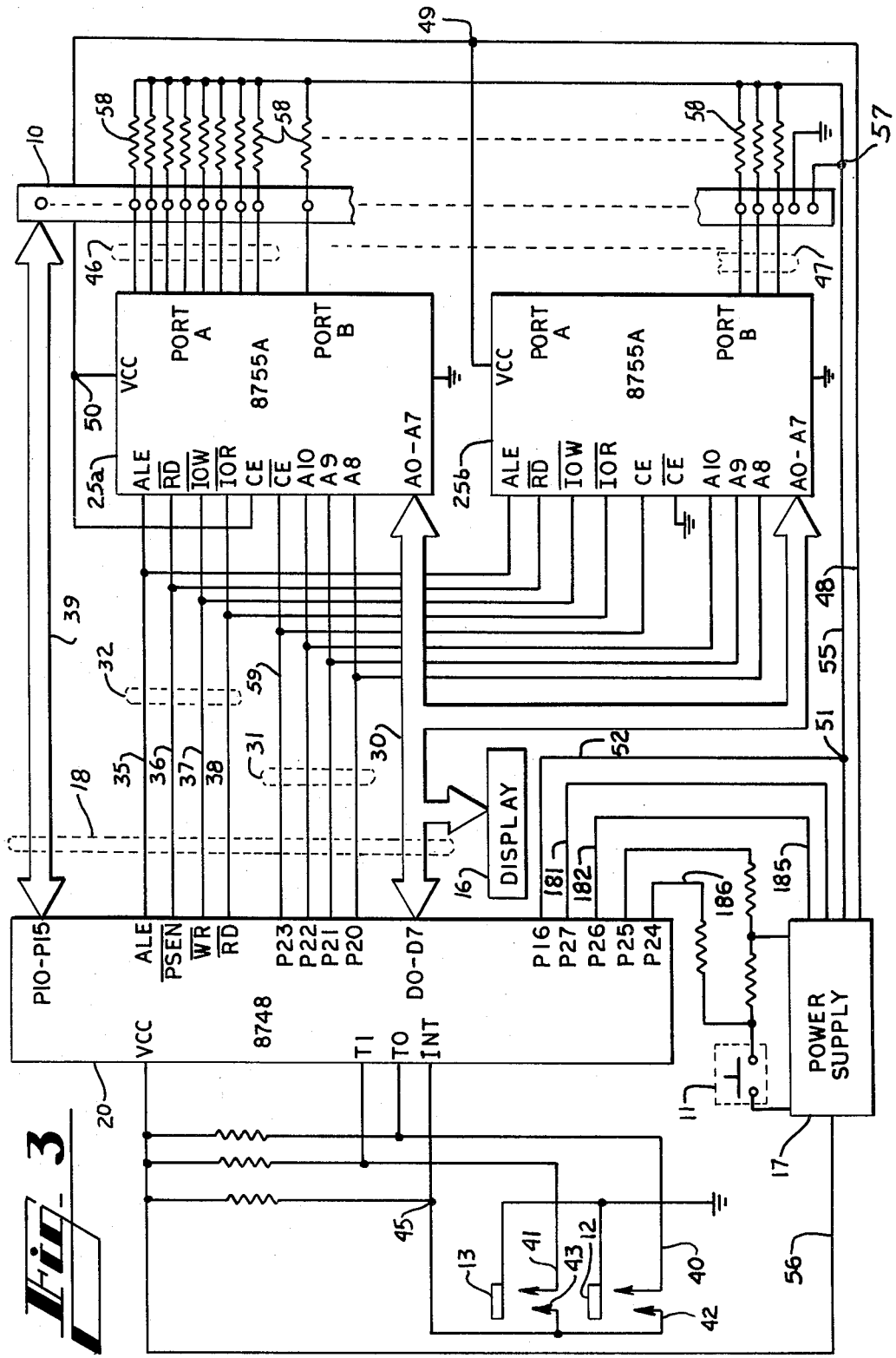
FIG. 3 is a partially schematic, partially block diagram of the preferred embodiment of the present invention.

Turning now to FIG. 3, the preferred embodiment of the present invention may be seen in greater detail. In the preferred embodiment of the present invention microcomputer 20 is embodied as a type 8748 eight bit one chip microcomputer currently manufactured by Intel Corporation of Santa Clara, Calif. It will be appreciated by those skilled in the art that detailed descriptions of the functioning of the 8748 microcomputer are available from the manufacturer, that sufficient detail will be presented herein to enable one skilled in the art to understand how the microcomputer works in the present invention, and how other microcomputers could be used to construct an embodiment of this invention.

The type 8748 microcomputer includes 1K of eight bit erasable programmable read only memory (EPROM). It will be appreciated by those skilled in the art that a type 8048 microcomputer could be used in the mass production of the preferred embodiment of the present invention since the type 8048 includes a masked programmable read only memory.

I/O/memory 25 (shown in FIG. 2) is embodied as two integrated circuits 25a and 25b shown in FIG. 3. Each of these circuits is an 8755A EPROM with I/O currently manufactured by Intel Corporation of Santa Clara, Calif. From the description of the 8755A follow, it will be apparent to those skilled in the art how other similar combinations of read only memory and I/O ports may be used to construct an embodiment of the present invention.

However, it is to be understood that the novel use of this otherwise standard device is one of the inventive features of the present invention.

Power supply 17 is shown as a block in FIG. 3 and will be described in further detail hereinbelow. Recall from the discussion of FIG. 2 that the 1K of memory for microcomputer 20 may be though of as being divided into two portions, an oprating system memory (28 in FIG. 2) and a roll table memory (29 in FIG. 2).

The 16K EPROM associated with each of the 8755A chips 25a and 25b is a 2KX8 memory and contains the program instructions for testing the various devices under test. It is to be understood that since each of chips 25a and 25b contain 2K eight bit words, a total of 4K external memory addresses must be accessible in the preferred embodiment shown in FIG. 3. Therefore twelve bits are required to address the external memory containing test procedure instructions in chips 25a and 25b.

The generalized bus 18 of FIG. 2 is shown as 18 in FIG. 3 and includes the following components; an eight bit bidirectional bus 30, a four bit quasi bidirectional bus 31 comprising one half of an eight bit bidirectional port from microcomputer 20; a four control line bus designated 32 comprising address latch enable line 35 (ALE), negated program store enable line 36 (PSEN), negated write line 37 (WR), and negated read line 38 (RD); and, a six bit bus 39 comprising a portion of another eight bit quasi bidirectional port from microcomputer 20. Six bit bus 39 connects directly to six pins of socket 10. Bus 39 will be understood to have pull up resistors internal to microcomputer 20 associated therewith and therefore does not need external pull up resistors.

Forward and reverse switches 12 and 13 have a pole connected to ground. As has been described hereinabove, these switches are double detent switches, and each contact for each detent may be seen in FIG. 3. The first level contact of switch 12 is designated 40 while the second contact thereof is designated 42. Thus it will be understood that depression of switch 12 to a first level will ground contact 40 and depression of said switch to a second level will ground both contacts 40 and 42. From FIG. 3 it may be seen that switch 13 operates in an analogous fashion. Note that contacts 42 and 43 of switches 12 and 13, respectively, are electrically identical and therefore the depression to the second level of either switch will ground point 45 which is connected to an input of microcomputer 20 designated as interrupt (INT).

The first level contacts of switches 12 and 13 (40 and 41, respectively) are tied to T0 and T1 test inputs of microcomputer 20. As will be explained in greater detail hereinbelow, this combination of double detent switches connected to testable inputs of microcomputer 20 provides one of the novel features of the present invention.

The outputs of power supply 17 appear on lines 48, 55, and 56. Line 56 supplies power to microcomputer 20 and to resistors associated with switches 12 and 13. Line 48 supplies power to chips 25a and 25b where it is tapped at points 49 and 50. Line 55 from power supply 17 supplies power to the unit under test at point 57 and to the external pull up resistors 58 which are connected to the receptors of socket 10.

As may be seen from FIG. 3, the lower eight address bits, A0–A7 of I/O/memory chips 25a and 25b are tied to bidirectional bus 30. The upper three address bits are tied to three bits of bus 31. Note that the P23 output of microcomputer 20 is tied to the negated chip enable (CE) of chip 25a and to the true chip enable of chip 25b. Therefore the P23 output of microcomputer 20 which appears on line 59 may be thought of as the most significant address bit of an address bus for accessing chips 25a and 25b in that it will select one chip or the other.

Socket 10 as shown in FIG. 3 is representative of the forty pins for socket 10 shown in FIG. 1 and the inputs and outputs to the socket terminals are as shown in FIG. 3. From point 57 the power supply from line 55 is provided also shown as a grounded pin of socket 10. Thirty-two pins of socket 10 are attached to four eight bit ports from chips 25a and 25b. The port A from I/O chip 25a is designated 46 and four bits of port B of I/O chip 25b are shown as 47 in FIG. 3. It is to be understood that each of these eight bit ports is an eight bit bidirectional port having pull up resistors 58 tied externally thereto. Six receptical from socket 10 are connected to bus 39 from pins P10–P15 of microcomputer 20.

It is to be understood that once switches 12 and 13 have been manipulated in order to select a test procedure for the unit under test which is plugged into socket 10, that depression of test button 11 will cause the preferred embodiment to execute an appropriate test procedures via the outputs from the bidirectional ports of I/O/memory chips 25a and 25b and bus 39 in order to see if the UUT is working properly. Among the novel features of the present invention to be described herein are the following. The method and apparatus associated with selecting the proper test procedure from the roll table will be described in conjunction with FIGS. 3 and 4. The value of the novel interconnection of microcomputer 20 and I/O/memory chips 25a and 25b will be discussed in connection with FIGS. 3 and 5. The novel power supply 17 which will be described in detail in conjunction with FIGS. 6 and 7 and the manner in which said power supply is controlled by microcomputer 20 in the preferred embodiment will also be described.

MANIPULATION OF THE ROLL TABLE

As indicated above, a table of alpha numeric characters representing various units which may be tested by the preferred embodiment is generated from information contained in the memory computer 20. Since the 1 K of internal memory for the particular type 8748 microcomputer must contain instructions for both the operating system and this table, it is desirable to pack the information necessary for such a table as densely as possible. This table is referred to as the "roll table" because operation of switches 12 and 13 cause the elements of the table to appear to roll either forward or reverse (in the sense of alpha numeric order) in display 16.

As was explained hereinabove, the preferred embodiment displays four alpha numeric characters in display 16 to identify a unit to be tested. Alpha numeric information is stored one byte per character as seven bit ASCII code in the roll table memory of microcomputer 20. The operating system of microcomputer 20 executes the steps set forth in the flow chart of FIG. 4. The novel combination of microcomputer 20 executing the logic set forth in FIG. 4 in combination with the connection to testable inputs (T0, T1, INT) of double detent switches 12 and 13 provides a distinct advantage in roll table density over any previous programmable circuit tester and is one feature of the present invention which allows a large number of test procedures to be stored in such a small embodiment.

The first element of the roll table will be stored as four bytes of seven bit ASCII code indicating the four characters to be displayed in display 16. These four bytes will be followed by two bytes containing the twelve bit address of the memory location in chips 25a or 25b in which the first step of the test procedure for the particular unit corresponding to the first element of the roll table is stored. For example, assume that the first element in the roll table which is an alpha numeric code representing a particular standard device to be tested is AAB4. Further assume that the test procedure for this particular circuit is located in memory in chips 25a and 25b which begins at location 960 (binary 001111000000 or page 4, word 192). If the first four bits of the first eight bit address byte is ignored then the total of twelve bits appearing in the last four bits of the first byte and all of the second bytes defines the address at which the first step of the test procedure for device AAB4 is to be found. The first address byte therefore contains four bits representing a 256 word page of external memory and the second byte locates the word within the page. In this example the first six bytes of roll table memory would appear as follows:
01110100
01000010
01000001
11000001
00000011
11000000

The first byte is a 0 followed by the seven bit ASCII code for the number 4. The second byte is a 0 followed by the seven bit ASCII code for the letter B. The third byte is a 0 followed by the ASCII code for the letter A and the fourth byte is a 1 followed by the ASCII code for the letter A. The one at the most significant bit is a flag indicating that this is the last letter in the name of this particular roll table element. Note that in the scheme described the rightmost character to appear in display 16 appears first. The four least significant bits of the next byte taken together with the following byte will form binary 001111000000 which is equivalent of decimal 960.

Continuing with the example, assume that the second element in the roll table is called AAB7. Assume furthermore that the memory address of the first step for the test procedure for AAB7 is an address 976. The second element of roll table memory would be stored as the following three bytes
11110111
00000011
11010000

Note that from AAB4 to AAB7 only the last character has changed when going from the name of the first device to the second device. Therefore the roll table memory stores only the character indicative of a changed character. Therefore the first byte of the second element is a one followed by the ASCII code for the number seven. The one indicates that this byte is the last byte in the name of the roll table element and that the next two bytes will contain the binary equivalent of the address 976. If two characters were changed going from one roll table element to the next contiguous table element then two ASCII code bytes would be presented in the portion of roll table memory corresponding to the second roll table element. Similarly whenever all four characters change going from element N to element N+1 four ASCII code bytes plus the two address bytes will need to be present in roll table memory. It will therefore be appreciated that the roll table memory of microcomputer 20 is a memory with name/address pairs stored in sequential addresses.

However, it may be appreciated that the density for the roll table memory is appreciably increased by having ASCII code representations only for characters which differ from the previous character present in the roll table memory.

In order to implement the entire roll table with the roll table memory scheme described above, it is necessary to generate the entire roll table down to a particular element of interest since the roll table is iterative in nature; that is, each individual set of bytes representing a roll table element does not have significance by itself without knowing what the bytes representing the previous element were.

Figure 4:
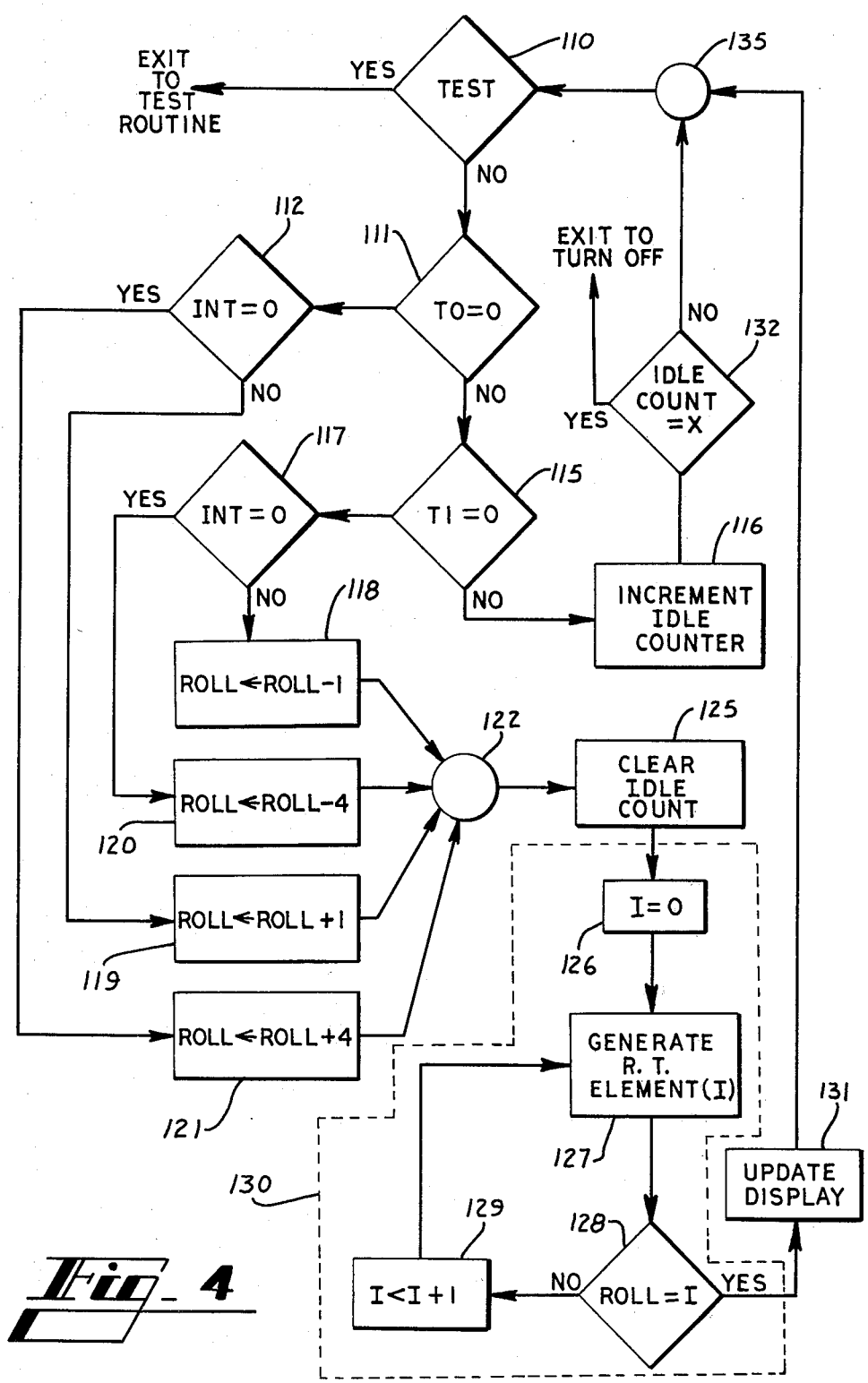
FIG. 4 is a flow diagram of the system of the present invention for selection of a particular test procedure.

Therefore microcomputer 20 executes the scheme set forth in FIG. 4 in response to operation of switches 12 and 13.

Consider FIG. 4 for a moment and that the preferred embodiment has been turned on. In the absence of other inputs from the operator, the software resident microcomputer 20 will continually execute a loop comprising steps 110, 111, 115, 116, 132. It first tests to see if the on/test switch has been depressed which would be indicated by a logical zero on input P24 of microcomputer 20 (FIG. 3). If the switch has not been pressed the operating system next tests to see if the T0 input of microcomputer 20 has been grounded through operation of switch 12 to its first detent level connecting with contact 40. If this has not happened a similar test is executed at step 115 to determine if testable input T1 has been grounded. Therefore steps 111 and 115 of the routine shown in FIG. 4 continually tests to see if double detent switches 12 and 13 have been operated to ground testable inputs T0 and T1, respectively. The system also includes appropriate monitoring steps (not shown) of 10 to 30 milliseconds to prevent contact bounce from being treated as separate inputs.

As will be appreciated by those skilled in the art, microcomputer 20 is of the type having a plurality of testable inputs including T0, T1 and interrupt (INT). This type of microcomputer includes an instruction set having instructions in the form of "jump on TESTABLE INPUT equal zero" where TESTABLE INPUT may be T0,T1, or interrupt (INT). So long as neither switch 12 nor 13 is operated the above described loop will be executed by the operating system of microcomputer 20. Note that in each pass through the loop a counter designated as IDLE COUNT is incremented at step 116 and then tested at step 132 to see if it equals a predetermined number X. If IDLE COUNT is allowed to reach X, it is indicative that no keyboard operation which would cause the tests of steps 110, 111 or 115 to be true has been executed for a predetermined amount of time and the software will exit to a routine by which the preferred embodiment turns itself off. Note that by the use of only three switches, 11, 12 and 13 as user inputs the testing routine in the software maintains considerable simplicity.

If the user has operated either switch 12 or switch 13, one or the other of steps 111 or 115, respectively, will test as true and in either case the software will jump to a test for the logic state present on the interrupt input. Note from FIG. 3 that the interrupt (INT) input is connected to point 45 which will be grounded when either switch 12 or 13 is depressed to its second detent level thereby connecting with either contact 42 or 43. It will be appreciated that either ground (logical zero) or a logical one level is a "signal source" and that the poles of switches 12 and 13 are connected to assigned source.

Assume for a moment that switch 12 has been operated by the operator in order to advance the roll table in display 16. If switch 12 has been operated only to its first detent level indicating that the operator desires a slow rolling of the roll table, the test set forth at step 112 of FIG. 4 will not be satisfied and a register designated as ROLL in FIG. 4 will be incremented by one indicating that the next contiguous element of the roll table is to be displayed. Step 119 then proceeds to step 125 which clears the IDLE COUNT and enters a loop designated as 130 which will generate in display 16 the Nth element of the roll table where N equals value of the variable ROLL. An index I is initiated at step 126. Starting with the beginning of the roll table, each element thereof is generated until the index I is equal to the current value of ROLL. At this point display 16 is updated at step 131 and microcomputer 20 then exits to its original loop testing for operation of switch 11, 12 or 13.

Note that loop 130 is executed upon each change in the roll table element to be displayed and that in order to generate a display of the alpha numeric element of the roll table the element must be created by starting at the beginning of the roll table and executing a routine (not shown) which will in an iterative fashion create the Nth element of the table. This is because, as has been described hereinabove, the roll table memory is compressed by having the (N+1)th element contain only alpha numeric bytes indicating how that element differs from the Nth element.

If instead of depressing switch 12 to its first level, the user of the preferred embodiment had depressed switch 12 to its second detent level, contact 42 would be grounded thus grounding point 45 and the INT input to microcomputer 20. As may be seen from FIG. 4, this would cause step 112 to test as true and the register ROLL in this case is incremented by four at step 121. The element is also displayed in display 16 for a shorter time than in the previous case. Otherwise operation of the system to generate roll table elements is identical. It is to be understood that the selection of four as an increment during fast rolling of the roll table is only preferred and has been determined empirically to be a number which will cause the roll table to scroll in a sufficiently rapid manner to satisfy most users and at the same time to display each selected roll table element in display 16 for a sufficient length of time so that the visual persistence can identify approximately where in the roll table the routine is.

It will be apparent to those skilled in the art that operation of switch 13 to reverse the roll table operates in an analogous fashion except that the ROLL variable is decremented by either one or four rather than incremented. Note however that once the ROLL variable is decremented, loop 130 still begins at the beginning of the roll table and generates roll table elements until the index variable I equals the current value of the ROLL variable.

It will therefore be appreciated that the present invention provides a means for generating an iterative table of elements in response to a plurality of double detent switches connected to testable inputs of a computer. It will further be appreciated that the first detent level of each of the double detent switches will activate a particular testable input while the second detent level for any of the plurality of switches will activate yet another testable input to the microcomputer.

Interfacing With Unit Under Test

The novel apparatus for interfacing with the unit under test plugged into socket 10 (FIGS. 1 and 3) will now be described with reference to FIGS. 3 and 5.

Among the novel features of the interfacing of microcomputer 20 to the unit under test include both the manner in which inputs and outputs are defined and provided the unit under test and also the new and nonobvious way of interconnecting a microcomputer and an I/O/memory device such as the type 8755 shown in the preferred embodiment.

Figure 5:
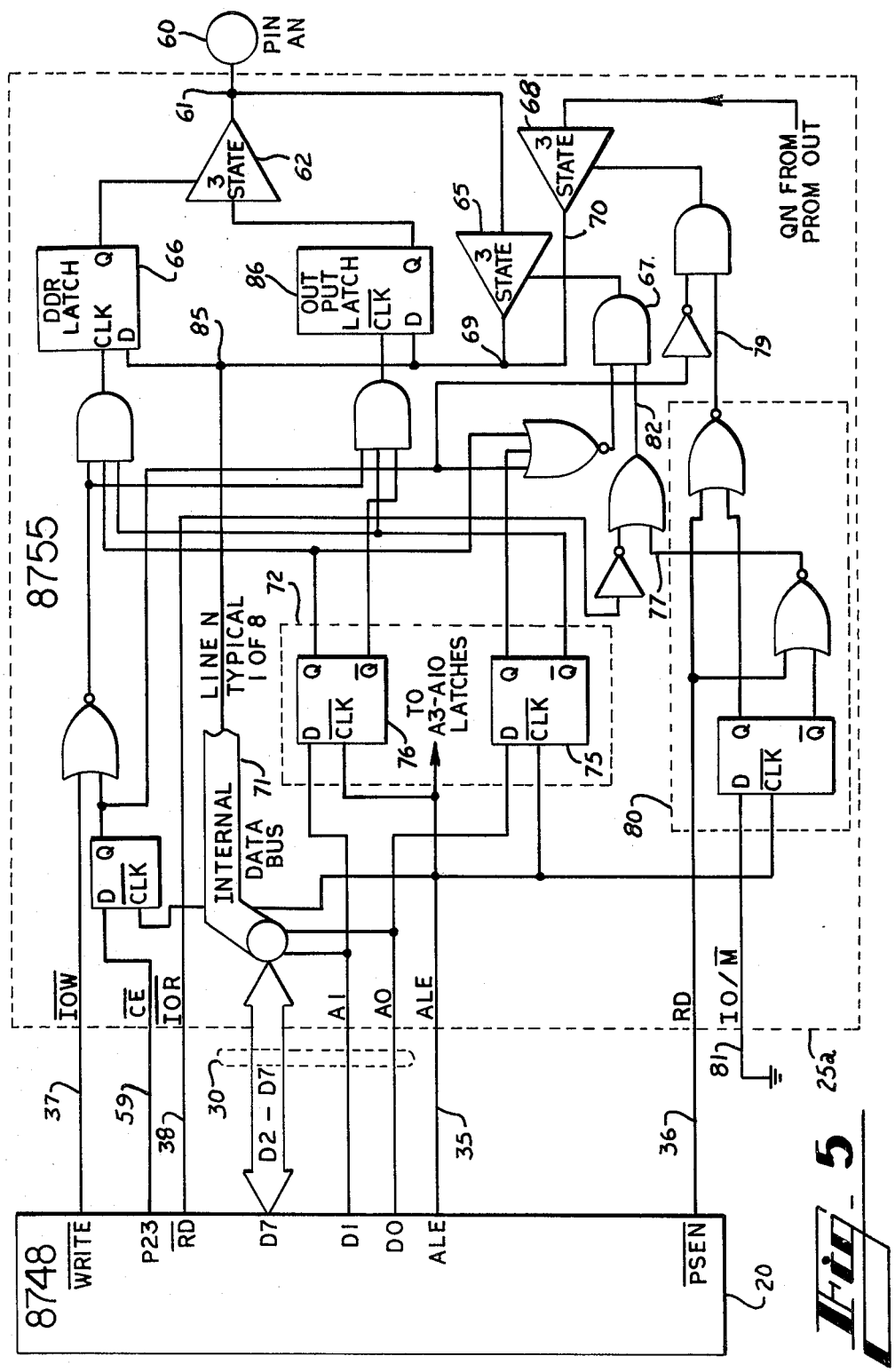
FIG. 5 is a diagram of the interface between a particular pin of the socket holding the unit under test and the preferred embodiment of the present invention.

From FIG. 5 it will be apparent to those skilled in the art that the interconnection of microcomputer 20 and I/O/memory device 25a is novel and not at all apparent. For example note that the connection of the read (RD) output of microcomputer 20 to the negated I/O/READ (IOR) input of chip 25a and the connection of the program store enable (PSEN) output of microcomputer to the read (RD) input of chip 25a are not suggested in any standard scheme for connecting the 8755A to a computer. Particularly such connections would not be used in either a standard I/O arrangement or a memory mapped I/O arrangement. When IOR is active it causes a reading of data at a port, such as I/O port 42 to be read onto bus 30 and thus is a port read input.

The scheme of interconnecting microcomputer 20 and I/O/memory devices 25a and 25b is one of the novel features of the present invention which allows the preferred embodiment to be made quite small while at the same time storing test routines for one hundred or more devices. In particular the means for interconnecting microcomputer 20 and I/O/memory devices 25a and 25b provide an addressing scheme wherein the microcomputer 20 treats accessing the I/O ports of chips 25a and 25b analogously to reading into or writing from external random access memory for a normal connection in a microcomputer system.

Similarly the interconnection of the program store enable from microcomputer 20 to the read input of chips 25a and 25b along line 36 assure that reading from the PROM portions of chips 25a and 25b only occurs when microcomputer 20 is fetching an instruction from external memory. As will be appreciated by those skilled in the art, the program store enable output of microcomputer 20 becomes active only when said microcomputer is making such a fetch. It will therefore be appreciated that the interconnection shown in FIGS. 3 and 5 provides a uniquely interconnected combination of standard devices which provides for treatment of the I/O ports of I/O/memory chips 25a and 25b as programmable interface adapters and the memory portions of I/O/memory chips 25a and 25b as program memory for the microcomputer. Furthermore, since in a preferred embodiment of the present invention only instructions for test routines are stored in 25a and 25b, these chips together with the unit under test are not powered up during the previously-described operation of the roll table thus saving a considerable amount of battery power.

Turning now to FIG. 5, the functional manifestations of the unique interconnection between microcomputer 20 and I/O/memory chips 25a and 25b will be explained. FIG. 5 shows, by way of example, the internal logical equivalent of a particular pin designated AN of output port A of I/O/memory device 25a. It will be understood by those skilled in the art that the portions of FIG. 5 bounded by the block 25a show logical equivalents of the actual type 8755 currently available.

Pin AN designated as 60 on FIG. 5 should be understood to be one pin of I/O port A of chip 25a. Therefore it will be understood that one line from bus 46 (FIG. 3) is connected to pin 60. Pin 60 is electrically connected to a point 61 which is both the output of a three state buffer 62 and the input to a three state buffer 65. Data direction latch (DDR) 66 controls the output of buffer 62 and AND gate 67 controls the output of buffer 65.

Another three state buffer 68 is connected to point 69 which may be seen from FIG. 5 to be on the internal data bus of the 8755A chip. Buffer 68 carries the Nth output line from the outputs of the PROM of the 8755A. Therefore line 70 carries the Nth bit of the output word from this PROM to the internal data bus 71 of the 8755A.

As will be appreciated by those skilled in the art, a plurality of latches designated as 72 are the address latches internal to an I/O/memory device such as the 8755. The latches for the two least significant bits are shown in FIG. 5 as 75 and 76. These latches contain a two bit pointing vector which determines the source and destination of data for the internal data bus 71. Latch 75 latches the least significant bit of data bus 30 when the address latch enable signal on line 35 exhibits a trailing edge. A zero in latch 75 points to port A of the 8755A in a one points to port B. Therefore as will be appreciated from FIG. 5, a zero must be latched into latch 75 for the exemplary pin 60 to be affected during subsequent operations while the ALE line is low.

Latch 76 latches a bit which points either to data direction register 66 when a one is latched or to output latch 86 when a zero is latched.

It will be appreciated by those skilled in the art that the circuitry enclosed in block 80 of FIG. 5 is such that the grounding of the I/O/M pin 81 causes the following results. During all operations of the 8755A after power is supplied and after the first strobing of line 35, line 77 will always remain a zero and therefore line 82 which in part controls the three state buffer 65 through AND gate 76 will simply be the logical inverse of line 38 to the negated IOR input. The grounding of input 81 also assures that line 79 is simply the logical inverse of the read input from line 36. Therefore when microcomputer 20 provides an active output on line 36 (logical zero) indicating that an instruction to be executed is being fetched from an external memory, line 79 will become a logical one and at point 69 the QN output from the PROM will be placed on the internal data bus of the 8755A and thus on bidirectional data bus 30.

Whenever a write operation is to take place from microcomputer 20 the data present at point 85 on line N of the internal data bus will be written into either the data direction register 66 or the output latch 86. The particular one of the latches 66 or 86 into which data is written is determined solely by the latched vector in address latch 72. Therefore, in testing a particular unit under test, the first write instruction from microcomputer 20 is one in which the latched output of address latch 76 is a one thus enabling writing into data direction latch 66.

As will be apparent from FIG. 5 a zero written into data direction latch 66 disables buffer 62 (places its output in a high impedence state) thus defining pin 60 as an input pin of the unit under test. All subsequent write (line 37 going low) operations from microcomputer 20 will be those which will write into output latches for each pin of ports A and B. With a zero in DDR latch 66 data written into the output latch 86 will be ignored since this data cannot pass through buffer 62. Of course some of the other pins are presumed to have had ones written into the data direction latches associated therewith and thus have been defined as inputs for the unit under test. These pins will have data from the latch associated therewith (which corresponds to output latch 86 shown in FIG. 5) placed onto the pin upon each write operation.

Any read operation from microcomputer 20 which is not accompanied by a program store enable pulse on line 36 will read the data present on pin 60. This data is at point 69 and thus on the internal data bus 71 of the 8755A. It will therefore be appreciated that a latched vector in latches 75 and 76 will point to a data direction latch during the first write operation from microcomputer 20 during a specified test. From that point on the contents of the data direction latches such as latch 66 shown in FIG. 5 will determine which pins from the I/O ports of the 8755As are inputs and which pins are outputs. Subsequent write operations will write into output latches for the I/O port. All subsequent read operations will either read the pins of the I/O ports or read an externally stored instruction from the PROM of the 8755A into microcomputer 20.

It will therefore be appreciated that once the contents of the data direction latches have been determined, that a read operation will read from the PROMS of the 8755A chips when line 36 is low and will take data from the I/O ports when line 36 is high. It will thus be appreciated that the unique interconnection between microcomputer 20 and I/O memory chip 25 which is shown in the preferred embodiment of the present invention allows the treating of the I/O ports of the 8755As as programmable interfaces. This connection has allowed microcomputer 22 to activate (logical zero) line 38 and require only program store enable control to determine whether actual data from the I/O port is to be read or a word is to be outputed from the PROM of 8755A.

The Power Supply of the Present Invention

Figure 6:
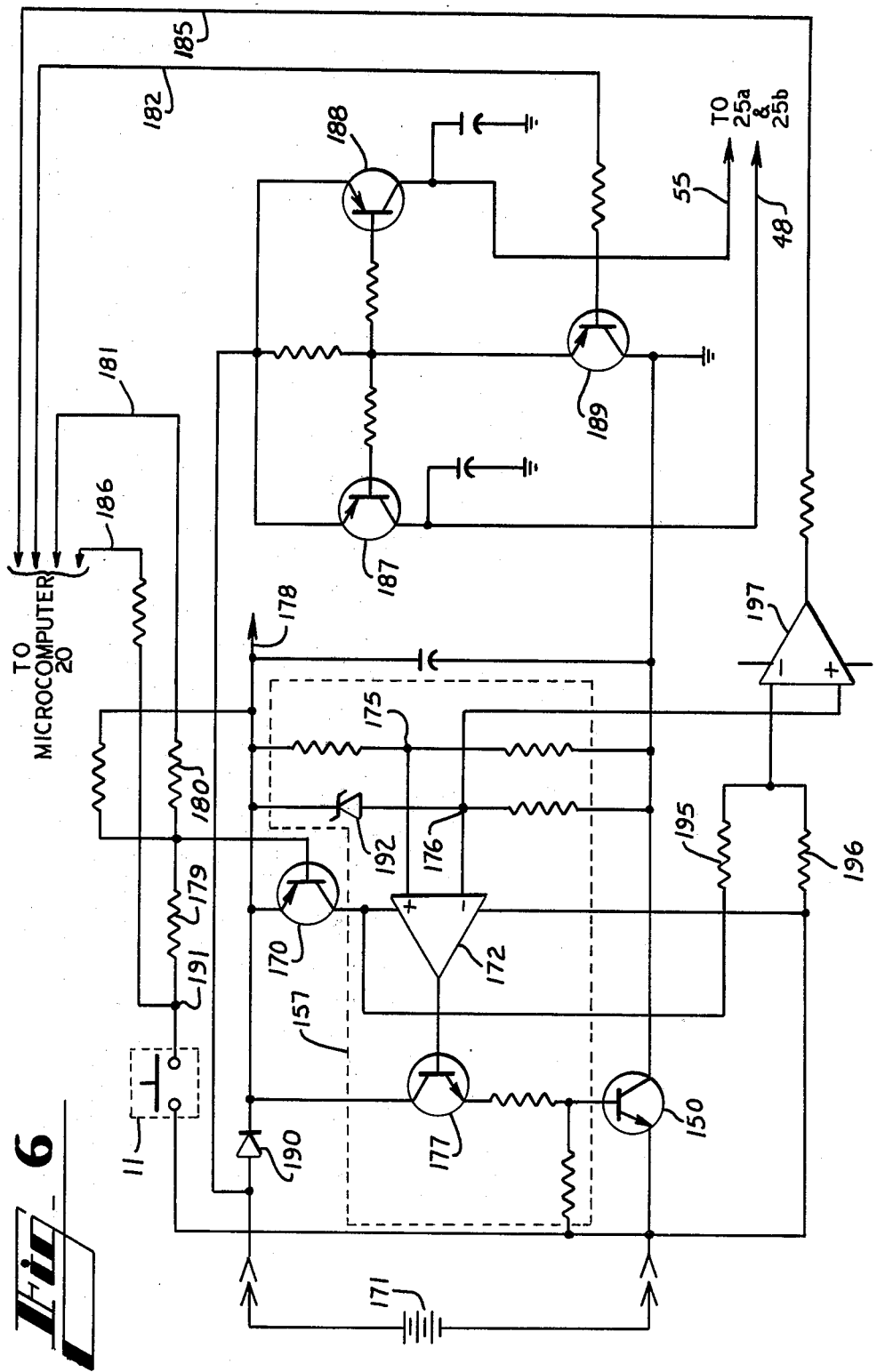
FIG. 6 is a schematic diagram of the novel power supply of the present invention.

The present invention also provides a unique power supply which is particularly suited but whose usefulness is not limited to battery operated portable devices. FIG. 6 is a schematic of the preferred embodiment of the novel power supply used in the preferred embodiment of the present invention.

FIG. 7A shows a conventional power supply using a series regulator pass transistor 145. Generalized analog circuitry shown as 146 generates a signal at point 147, the base of transistor 145. When switch 149 is turned on, base current is supplied to transistor 145 through resistor 148. As is known to those skilled in the art, a conventional voltage regulator using a series pass transistor such as that shown in FIG. 7A is a species of an emitter follower amplifier. Such regulators have several drawbacks which do not affect the improved supply of the present invention. Conventional regulators required a minimum differential of approximately two volts between the input voltage (Vin) and the output voltage (Vout). This represents in the case of low voltage battery operated portable equipment a rather significant fraction of the power supplied by the battery.

The second disadvantage of conventional regulators is the fact that the on-off switch for the system such as switch 149 shown in FIG. 7A must have the capacity to carry the entire load current plus current going to bias the regulator. While this is not usually a significant problem in battery operated portable equipment, it increases the cost of equipment using higher currents.

The minimum voltage differential between the output and the input voltages for conventional series regulated power supplies impresses limitations on the types of batteries which may be used in a given piece of equipment. Particularly the use of nickel-cadmium batteries may be precluded in the case in which it is necessary to maintain a battery output voltage of 7 volts or more. In such a case, the user of the equipment may be forced to go to more expensive disposable batteries rather than be able to take the advantage of recharageable batteries such as those of nickel-cadmium construction.

FIG. 7B shows a conceptually simple representation of the improved power supply of the present invention. The power supply of FIG. 7B includes a series pass transistor 150, an on-off switch 151 in series with a resistor 152 going to the base of transistor 155 which supplies current along line 156 to the generalized analog control circuitry represented as 157. Analog control circuitry 157 provides base current along line 158 to transistor 150. The power supply of FIG. 7B has a raw DC input port labeled Vin and a regulated output port labeled Vout. The most striking unconventional feature of the regulator of FIG. 7B is the fact that pass transistor 150 is an NPN transistor but appears in the negative leg of the power supply. Note in FIG. 7A that a PNP pass transistor is in the negative leg of the power supply. As is well known to those skilled in the art, an equivalent circuit for FIG. 7A exists for which an NPN series pass transistor will appear in the positive leg of the power supply. It is also well known to those skilled in the art that a conventional series regulator such as that shown in FIG. 7A will not work at all if transistor 145 were to be replaced with a NPN transistor in the negative leg.

A second feature of the novel power supply of the present invention as shown in FIG. 7B is the fact that the on-off switch 151 only carries the base current to transistor 155 and does not have to have a current carrying capacity equal to all of the current supplied at the input voltage port. When switch 151 is closed base current is provided to transistor 155 through resistor 152. This turns on transistor 155 which allows current to flow through line 156 and allows generalized analog circuitry 157 to provide base drive through line 158 to transistor 150 thus operating the regulator. An advantage of the novel power supply of the present invention is that it may regulate the output voltage through a voltage differential between the input and the output voltage all the way down to the collector emitter saturation voltage for transistor 150.

It will be apparent to those skilled in the art that the opening of switch 151 removes all base drive from transistor 155 which prevents current from flowing along line 156 to analog control circuitry 157. This in turn removes base drive from transistor 150 turning off the regulator. Note that the entire power supply may be controlled by switch 151 which must carry only the base current for transistor 155. Thus, in high current applications an entire machine and regulator may be switched on and off by a switch carrying a much smaller current than that supplied at the input port. This is particularly true when it is considered that transistor 155 may be a relatively low current variety since it must only supply base drive to transistor 150 and enough current to properly operate analog control circuitry 157.

Before describing in detail an embodiment of analog circuitry 157 several advantageous and novel switching arrangements with the novel power supply of the present invention will be described.

FIG. 7C shows an advantageous means for switching the power supply of the present invention on and off. This embodiment is controlled by a pair of pushbutton switches 160 and 159. Assume initially that the power supply and any load connected to the output port are off. Operation of switch 160 supplies base drive to transistor 155 through resistor 152. When transistor 155 turns on activating analog circuitry 157 and providing base drive to transistor 150, the circuit will remain on since transistor 155 may then be supplied with base drive current through resistor 161 on the output side of pass transistor 150.

Operation of switch 159 shorts the base-emitter junction of transistor 155 thus cutting it off. This terminates operation of analog control circuitry 157 removing base drive from pass transistor 150 so thus terminates the supply of base drive to transistor 155 through resistor 161. Thus the regulator and any load device will be cut off. Note in this case that switches 159 and 160 again must only be sufficient to carry the base current for transistor 155 or in the case of switch 159 the current provided through resistor 161 by the output voltage. Also these switches must only carry these currents momentarily. Thus it will be apparent that switches of much lower current rating than are required of conventional regulators may be used in the regulator of FIG. 7C. Note that resistor 161 provides a means for latching on the regulator which is connected to the output port of the regulator. The transition from off to on is supplied via a temporary connection (switch 160) to the input port.

FIG. 7D shows yet another improvement which generically represents the power supply for the preferred embodiment of the present invention. Rather than having the off function controlled by a switch such as 159 of FIG. 7C, FIG. 7D shows a situation in which the regulator is used to supply regulated voltage to a powered logic unit 162. Logic unit 162 may be any apparatus which is powered by the output from the regulator. The logic unit is designed, as is the preferred embodiment, to provide a logical zero on line 165 upon the condition of being powered up, the logical zero at line 165 will provide a path for base drive through resistor 163 to transistor 155 just as in the case of resistor 161 providing base drive in the example of FIG. 7C.

Therefore if logic unit 162 maintains a logical zero on line 165 upon powering up, the logic unit may respond to any predetermined set of inputs or to raise the voltage on line 165 to a logical one thus shorting the base-emitter junction of transistor 155 cutting off the regulator. This of course cuts off the logic unit also and provides apparatus whereby an output having a current sinking capacity no greater than the base current required to keep transistor 155 on may be used to turn off both the logic unit and the regulator supplying it with power. All this is accomplished without the use of a relay or any other device capable of carrying the entire load current in addition to series regulator transistor 150 which much carry the load current in any conventional regulator. Logic unit 162 is generically a utilization circuit connected to the output port of the regulator.

With the general nature of the improved regulator of the present invention in mind, the preferred embodiment thereof used in the preferred embodiment of the present invention shown in FIG. 6 will now be described. As may be seen from FIG. 6 the block labeled 157 corresponds to analog control circuitry 157 of FIGS. 7B, 7C, and 7D. The operation of on/test switch 11 momentarily ties the base of transistor 170 to the negative terminal of battery 171 turning the transistor on. It may thus be appreciated that the base of transistor 170 is a control input to a means for controlling current to op amp 172.

When transistor 170 turns on power is applied to low power operational amplifier 172. Intrinsic imbalances in amplifier 172 cause it to drive transistor 177 on. Operational amplifiers as a species have intrinsic imbalance which will cause them to provide a positive voltage at their outputs when their power supply is turned on. However an additional intrinsic imbalance may be created by placing a resistor and diode in series between points 176 and 191. The operation of transistor 177 supplies base drive to transistor 150 which turns on the entire regulator and thus provides power to the microcomputer 20. It is to be understood that the positive power supply lead of microcomputer 20 is connected to point 178.

It will be appreciated by those skilled in the art that the function of transistor 170 may be performed by other switching devices such as mos devices. Under such circumstances a properly biased gate terminal is the equivalent of the base of transistor 170 and serves as a control input.

Note that the base of transistor 170 is connected through resistor 180 to line 181 which in the preferred embodiment is provided to the P27 output of microcomputer 20 shown in FIG. 3. Part of the start up program for the operational system stored in the memory of microcomputer 20 is to hold pin P27 low thus providing base drive to transistor 170 which keeps amplifier 172 on. In the preferred embodiment of the present invention, amplifier 172 is embodied by one of the amplifiers in a type LM358 dual operational amplifier package currently manufactured by National Semiconductor Corporation of Santa Clara, Cal.

Transistors 187, 188 and 189 control the power supplied to I/O/memory chips 25a and 25b and the unit under test. Once an appropriate test procedure for the unit under test has been selected from the roll table as described hereinabove, operation of on test button will cause the test to begin. The first operation which must be performed is to supply power to the I/O/memory chips and the unit under test. This is accomplished when line 182 which is connected to output P26 of microcomputer 20 goes low. This event turns on transistor 189 which supplies base drive to transistors 187 and 188 supplying power to the external units along lines 48 and 55.

Note that Schottky diode 190 has been provided in the positive leg of the power supply for the microcomputer to compensate for the drops which occur in transistors 187 and 188.

By use of the arrangement shown in FIG. 6, on/test switch 11 may also be used to input data to microcomputer 20. Line 186 which is connected to input P24 of microcomputer 20 senses the position of on/test switch 11. Operation of switch 11 takes point 191 low which may be sensed by microcomputer 20. Upon release of switch 11, point 191 is pulled up by resistor 179.

As may be seen from FIG. 6, amplifier 172 is responsive to the differential voltage between points 175 and 176. It will be apparent that the noninverting terminal connected to point 175 is at a fraction of the output voltage between regulator ground and point 178. Point 176 is maintained a constant potential with respect to point 178. This constant potential is the zener voltage of diode 192. In the preferred embodiment Vz is three volts. Therefore as the output voltage between ground and point 178 rises, point 175 becomes more negative with respect to point 176. This causes the output of amplifier 172 to fall tending to reduce the emitter current of transistor 177 which deprives transistor 150 of base drive thus increasing the collector-emitter voltage of transistor 150 and tending to lower the output voltage of the regulator.

The preferred embodiment of the present invention also includes an additional feature for ascertaining when battery voltage is low. Operational amplifier 197 is used to detect a low battery condition which will be signalled along line 185 to the P25 input of microcomputer 20. In the preferred embodiment, amplifier 197 is conveniently the other half of the type LM358 dual low power operational amplifier chip from which amplifier 172 is obtained. The noninverting input of amplifier 197 is connected to point 176. The inverting input of amplifier 197 is connected to a voltage divider which senses a fraction of the voltage between the collector of transistor 170 and the negative battery terminal. Therefore when the output voltage of battery 171 drops below a predetermined level, the output of amplifier 197 will swing negative pulling line 185 low. When this condition is sensed by microcomputer 20 a routine within the operating system is executed which alerts the user through display 16 that the device is preparing to turn off and then in fact turn the apparatus off.

It will be appreciated by those skilled in the art that other embodiments of the present invention may be constructed based on the disclosure herein with the foregoing description of the preferred embodiment has been by way of example. Therefore the scope of the present invention is to be limited only by the claims below.

I claim:

1. An automatic circuit testing apparatus comprising in combination:

a receptacle means for providing electrical contact with a unit under test;

at least one integrated circuit input/output memory device including memory, at least one input/output port, a data bus, a port/memory selector pin connected to a signal source corresponding to selection of memory, a read input responsive to an active state thereon to read onto said data bus data from said memory when said port/memory selector pin is in a first state and to read onto said data bus data from said input/output port when said port/memory selector pin is in a second state, a port read input responsive to an active state thereon to cause data present at said input/output port to be provided onto said data bus and a port write input responsive to an active state thereon to write data present on said data bus to said input/output port;

a microcomputer including a microcomputer data bus, a write output for providing an active output state in response to said microcomputer executing an instruction to write data present on said computer data bus to an external device, a read output having an active state corresponding to said microcomputer accepting data from said computer data bus and a program store output having an active state corresponding to said computer seeking to accept data on said computer data bus as an instruction;

means for electrically connecting said input/output port and said receptacle means; and means for connecting said microcomputer to said integrated circuit input/output memory device including a means for connecting said computer data bus to said data bus, a connection between said write output and said port write input, a connection between said read output and said port read input, and a connection between said program store output and said read input.

2. An automatic tester as recited in claim 1 wherein said integrated circuit input/output memory device is of a type in which said input/output port further comprises:

an output latch including a buffered output for storing output data;

a direction latch for controlling said buffered output;

at least one pointing latch for steering data to said output latch in response to an active state on said port write input when said pointing latch is in a first state and alternately for steering data to said direction latch in response to an active state on said port write input when said pointing latch is in a second state different from said first state.

3. In an automated testing apparatus comprising a microcomputer including at least two inputs in a jump instruction of the instruction set of said microcomputer and a display, the improvement of:

at least one double detent switch each including a pole connected to a signal source, a first contact connected to one of said testable inputs and a second contact connected to another of said testable inputs, said double detent switch being selectively operable to connect said pole to said first contact and alternately to connect said pole to both said first contact and said second contact;

a memory accessed by said microcomputer, which memory stores data corresponding to a plurality of names in a plurality of name/address combinations in sequential addresses of said memory;

program means accessed by said microcomputer for controlling the outputs of said microcomputer which outputs cause said display to provide a visible representation of said plurality of names in a predetermined order at a first rate in response to said pole contacting only said first contact and for providing to said display visible representations of said plurality of names in a predetermined order at a second rate in response to said pole contacting both said first contact and said second contact.

* * * * *